United States Patent [19]
Kaku et al.

[11] Patent Number: 5,557,632
[45] Date of Patent: Sep. 17, 1996

[54] DEMODULATION AND ROLL-OFF FILTER APPARATUS

[75] Inventors: Takashi Kaku; Hiroyasu Murata, both of Kawasaki, Japan

[73] Assignee: Fujitsu Limited, Kawasaki, Japan

[21] Appl. No.: 29,238

[22] Filed: Mar. 10, 1993

[30] Foreign Application Priority Data

Mar. 10, 1992 [JP] Japan .................... 4-051431

[51] Int. Cl.$^6$ .............. H03D 1/00; H04L 27/06; H04B 1/10
[52] U.S. Cl. .......................... 375/340; 375/350
[58] Field of Search ................ 375/103, 94, 80; 364/724.1, 724.16, 724.01; 329/323, 306

[56] References Cited

U.S. PATENT DOCUMENTS 4,607,230  8/1986  Kaku et al. ................ 375/94

Primary Examiner—Stephen Chin
Assistant Examiner—Duane Kobayashi
Attorney, Agent, or Firm—Staas & Halsey

[57] ABSTRACT

A demodulation and roll-off filter apparatus comprises a demodulation portion, a decimation portion, a demodulation and roll-off filter portion, and a modulation portion. The demodulation portion converts a pass-band signal received from an A/D converter into a base-band signal. The decimation filter portion lowers the sampling frequency of the base-band signal into a frequency four times higher than the frequency of a demodulation carrier used for the demodulation and roll-off filter portion. The modulation portion converts a base-band signal received from the decimation filter portion into a pass-band signal. The demodulation and roll-off filter portion performs a simplified demodulation and roll-off filter process for the pass-band signal.

10 Claims, 13 Drawing Sheets

| | a8 | a7 | a6 | a5 | a4 | a3 | a2 | a1 |
|---|---|---|---|---|---|---|---|---|
| t1 | 0 | -R7*C2 | 0 | R5*C4 | 0 | -R3*C6 | 0 | R1*C8 |
| t2 | R9*C1 | 0 | -R7*C3 | 0 | R5*C5 | 0 | -R3*C7 | 0 |
| t3 | 0 | R9*C2 | 0 | -R7*C4 | 0 | R5*C6 | 0 | -R3*C8 |
| t4 | -R10*C1 | 0 | R9*C3 | 0 | -R7*C5 | 0 | R5*C7 | 0 |
| t5 | 0 | -R10*C2 | 0 | R9*C4 | 0 | -R7*C6 | 0 | R5*C8 |
| t6 | R11*C1 | 0 | -R10*C3 | 0 | R9*C5 | 0 | -R7*C7 | 0 |

Fig. 7A

|    | a8       | a7       | a6       | a5       | a4       | a3       | a2       | a1       |
|----|----------|----------|----------|----------|----------|----------|----------|----------|
| t1 | 0        | R7(-C2)  | 0        | R5(+C4)  | 0        | R3(-C6)  | 0        | R1(+C8)  |
| t2 | R9(+C1)  | 0        | R7(-C3)  | 0        | R5(+C5)  | 0        | R3(-C7)  | 0        |
| t3 | 0        | R9(+C2)  | 0        | R7(-C4)  | 0        | R5(+C6)  | 0        | R3(-C8)  |
| t4 | R10(-C1) | 0        | R9(+C3)  | 0        | R7(-C5)  | 0        | R5(+C7)  | 0        |
| t5 | 0        | R10(-C2) | 0        | R9(+C4)  | 0        | R7(-C6)  | 0        | R5(+C8)  |
| t6 | R11(+C1) | 0        | R10(-C3) | 0        | R9(+C5)  | 0        | R7(-C7)  | 0        |

Fig. 7B

|    | b8     | b7      | b6     | b5      | b4     | b3     | b2     | b1     |
|----|--------|---------|--------|---------|--------|--------|--------|--------|
| t1 | R8*C1  | 0       | -R6*C3 | 0       | R4*C5  | 0      | -R2*C7 | 0      |
| t2 | 0      | R8*C2   | 0      | -R6*C4  | 0      | R4*C6  | 0      | -R2*C8 |
| t3 | -R10*C1| 0       | R8*C3  | 0       | -R6*C5 | 0      | R4*C7  | 0      |
| t4 | 0      | -R10*C2 | 0      | R8*C4   | 0      | -R6*C6 | 0      | R4*C8  |
| t5 | R11*C1 | 0       | -R10*C3| 0       | R8*C5  | 0      | -R6*C7 | 0      |
| t6 | 0      | R11*C2  | 0      | -R10*C4 | 0      | R8*C6  | 0      | -R6*C8 |

Fig. 8A

|  | b8 | b7 | b6 | b5 | b4 | b3 | b2 | b1 |
|---|---|---|---|---|---|---|---|---|
| t1 | R8(+C1) | 0 | R6(-C3) | 0 | R4(+C5) | 0 | R2(-C7) | 0 |
| t2 | 0 | R8(+C2) | 0 | R6(-C4) | 0 | R4(+C6) | 0 | R2(-C8) |
| t3 | R10(-C1) | 0 | R8(+C3) | 0 | R6(-C5) | 0 | R4(+C7) | 0 |
| t4 | 0 | R10(-C2) | 0 | R8(+C4) | 0 | R6(-C6) | 0 | R4(+C8) |
| t5 | R11(+C1) | 0 | R10(-C3) | 0 | R8(+C5) | 0 | R6(-C7) | 0 |
| t6 | 0 | R11(+C2) | 0 | R10(-C4) | 0 | R8(+C6) | 0 | R6(-C8) |

Fig. 8B

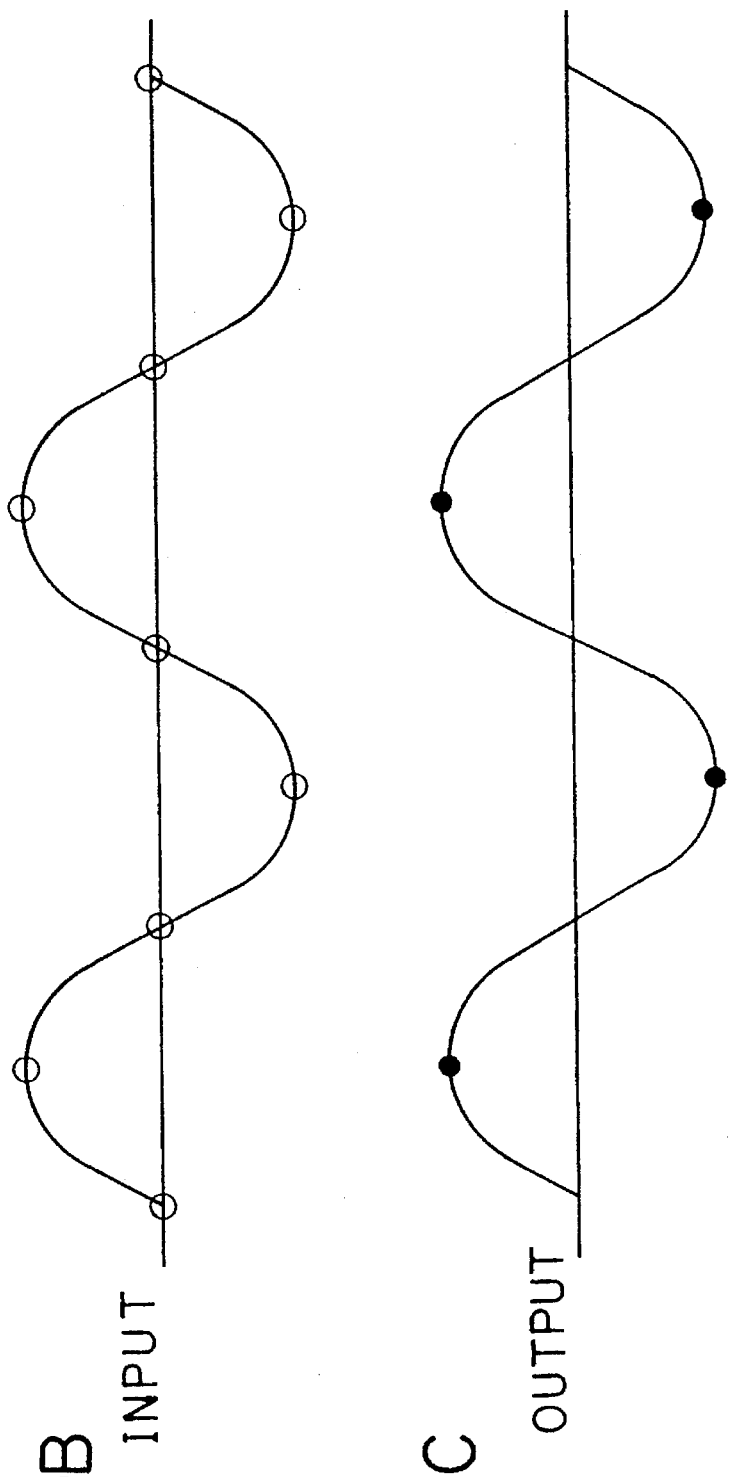
Fig. 9B INPUT
Fig. 9C OUTPUT

DEMODULATION AND ROLL-OFF FILTER APPARATUS

BACKGROUND OF THE INVENTION

1. Field of the Invention

The present invention relates to a demodulation and roll-off filter apparatus for performing a demodulation process and a roll-off filter process on a received signal by digital signal processing for use with a modem (modulation and demodulation unit) or the like.

2. Description of the Related Art

Modems which transmit and receive data to and from analog voice band lines such as public telephone lines and dedicated lines have been used.

In recent years, modems which encode and decode digital signals have been formed into LSI chips so as to reduce the size and cost thereof.

In a decoding process for a digital signal, as well as to demodulate a received signal which has been modulated, it is necessary to shape the waveform of the received signal which has been distorted over a transmission line by noise and so forth. In particular, it is important to ideally shape a received signal which has been demodulated. This shaping process is accomplished by a special filter process referred to as a roll-off filter process. When digital signal processing in a modem is performed by a DSP (Digital Signal Processor) and a CPU (Central Processing Unit) contained therein, the memory capacity and number of arithmetic operations used for the demodulation process and the roll-off filter process should be reduced so as to reduce the size and cost of the modem.

FIGS. 1 and 2 are schematic diagram showing the construction of a related art reference.

In FIG. 1, reference numeral 1 is an A/D (Analog/Digital) converter 1 used for a receive portion of a modem. The A/D converter 1 samples a signal received from a communication line, converts the signal into a digital value, and sends it to a DSP 2.

A demodulation and roll-off filter portion 3 of the DSP 2 demodulates the digital signal with a demodulation carrier and shapes the waveform of the signal according to a roll-off filter process. The demodulation and roll-off filter portion 3 sends the resultant signal to an Automatic Gain Control (AGC) portion 4. The AGC portion 4 automatically controls the gain of the digital signal so as to keep the level thereof constant. Thereafter, the AGC portion 4 sends the resultant signal to an automatic equalization portion 5. The automatic equalization portion 5 equalizes the received signal. Thus, communication data is reproduced.

As shown in FIG. 2, the demodulation and roll-off filter portion 3 comprises a demodulation portion and a transversal filter. In the demodulation portion, a multiplication portion 30 multiplies a received signal R by the cosine component of the demodulation carrier and outputs a real component R. Hereinafter, the cosine component is referred to as the cos carrier. On the other hand, a multiplication portion 32 multiplies the received signal R by the negative of the sine component of the demodulation carrier and outputs an imaginary component I. Hereinafter, the negative sine component is referred to as the −sin carrier. For the real component R and the imaginary component I, a wave-shape process, an automatic gain control process, and an automatic equalization process are performed as a roll-off filter process. This roll-off filter process will be described later. For the real component R and imaginary component I, a data reproduction process (which is not shown in the figure) is executed. Thus, communication data is reproduced.

For the real component R and imaginary component I which are sent from the multiplication portions 30 and 32, a roll-off filter process is performed by a transversal filter with, for example, eight taps.

The real component R is serially inputted to taps A8, A7, ..., A2, and A1, each of which performs a delay process of a predetermined time (T/6). The tap outputs A8 to A1 are multiplied by tap coefficients C1 to C8, respectively. An addition portion 31 adds the multiplication outputs a8, a7, ..., a2, and a1. Thus, a real output X is obtained as the result of the additions. In the multiplication process and addition process, for a sample sequence of the outputs of the taps A8 to A1, a process for decimating samples at intervals of one discrete time apart is executed. This process is referred to as the ½ decimation process.

On the other hand, the imaginary component I is serially inputted to taps B8, B7, ..., B2, and B1, each of which executes a delay process of T/6. The tap outputs B8 to B1 are multiplied by tap coefficients C1 to C8, respectively. An addition portion 33 adds the multiplication outputs b8, b7, ..., b2, and b1. Thus, an imaginary output Y is obtained as the result of the additions. In the multiplication process and addition process, for a sample sequence of the outputs of the taps A8 to A1, the ½ decimation process is executed.

Thus, the waveforms of the real output X and the imaginary output Y are ideally shaped.

In the DSP 2, the taps of the demodulation and roll-off filter portion 3 are constructed of a RAM (Random Access Memory) device. The tap coefficients and the demodulation carrier are stored in ROM (Read Only Memory) device. The above multiplications are executed by an arithmetic and logic unit in the DSP 2.

However, the above-mentioned related art reference has the following drawbacks.

(1) To raise the data transmission rate over a transmission line with a limited bandwidth, the modulation rate needs to be raised and the roll-off ratio of the roll-off filter process needs to be decreased. However, when the roll-off ratio is decreased, it takes a long time for the impulse response to converge. Thus, the number of taps and coefficients used for the roll-off filter process increases.

(2) When a received signal is modulated according to the FDM (Frequency Division Modulation) system, the amount of attenuation of unnecessary band components needs to be increased so as to obtain a good S/N ratio. Thus, the number of taps and coefficients for the roll-off filter process increases.

As described above, to lower the roll-off ratio or to increase the amount of attenuation of the unnecessary band components, the number of taps and coefficients should be increased to the order of, for example, 400. Thus, the capacity of the RAM device which constructs the taps increases. In addition, the capacity of the ROM device which stores the coefficients increases. Moreover, the number of arithmetic operations increases. The circuit scale of the apparatus increases as a result of the necessity of increasing processors and external RAMs, etc., thereby obstructing the reduction of the size and cost of the apparatus.

SUMMARY OF THE INVENTION

The present invention is made from the abovementioned point of view.

An object of the present invention is to prevent the circuit scale of a demodulation and roll-off filter apparatus from being increased even if the roll-off ratio is lowered or the amount of attenuation of unnecessary band components is increased.

The present invention is a demodulation and roll-off filter apparatus for performing a demodulation and roll-off filter process for a received digital signal sampled by an analog/digital converter, comprising a sampling frequency set portion for setting the sampling frequency of the received digital signal to a frequency four times higher than the frequency of a demodulation carrier therefor, a tap portion, connected in a cascade shape one after the other, for delaying samples of the received digital signal by a predetermined time, the first tap of the tap portion being connected to the sampling frequency set portion, a first multiplication portion for multiplying outputs of a first group of taps disposed in the tap portion at intervals of one discrete time apart by first tap coefficients, the first group consisting of taps disposed at intervals of one tap apart, a first addition portion for adding outputs of the first multiplication portion, a first polarity addition portion for adding a first polarity and a second polarity to the result of the additions of the first addition portion in a first timing and a second timing, respectively, and for outputting the new result as a real component, the first and second timings being cyclically generated, a second multiplication portion for multiplying outputs of a second group of taps other than the first group disposed in the tap portion at intervals of one discrete time apart by second tap coefficients, the second group consisting of taps disposed at intervals of one tap apart, a second addition portion for adding outputs of the second multiplication portion, and a second polarity addition portion for adding a third polarity and a fourth polarity to the result of the addition of the second addition portion in the first timing and the second timing, respectively, and for outputting the new result as an imaginary component.

The sampling frequency set portion comprises a pass-band/base-band conversion portion for converting the received digital signal which is a pass-band signal received from the analog/digital converter into a base-band signal, the pass-band signal having any sampling frequency, the base-band signal having a first frequency, a decimation process portion for performing a filter process and a decimation process for the base-band signal received from the pass-band/base-band conversion portion, so as to convert any sampling frequency of the base-band signal into a frequency four times higher than the frequency of a demodulation carrier for the received digital signal, the filter portion being adapted to attenuate a component at a frequency exceeding a predetermined frequency contained in the base-band signal, the decimation process being adapted to decimate samples of the base-band signal at discrete times a predetermined interval apart, and a base-band/pass-band conversion portion for converting the base-band signal received from the decimation process portion into the pass-band signal with a second frequency and for inputting the pass-band signal to the first tap of the tap portion.

The second frequency is the frequency of the demodulation carrier for the received digital signal.

According to the present invention, when the sampling frequency of the received signal is four times as high as the frequency of the demodulation carrier, the number of arithmetic operations for multiplying each tap output by a relevant coefficient in the demodulation and roll-off filter process and the number of arithmetic operations for adding the multiplication results can be halved in comparison with the case where the above condition is not set. In addition, two tap sequences for the real and imaginary components which are required for the related art reference can be reduced to one tap sequence where the received signal is directly inputted.

At this point, the sampling frequency set portion which comprises for example the pass-band/base-band conversion portion, the decimation process portion, and the base-band/pass-band conversion portion can convert for sampling frequency of the received digital signal any sampling frequency of the analog/digital converter into a frequency four times higher than the frequency of the demodulation carrier used in the demodulation and roll-off filter process. In addition, the decimation process portion has a function of attenuating unnecessary band components. Thus, the condition for the attenuation function for unnecessary band components in the demodulation and roll-off filter process can be alleviated. As a result, the number of arithmetic operations for the demodulation and roll-off filter process and the capacity of the RAM devices for the taps can be further decreased.

These and other objects, features and advantages of the present invention will become more apparent in light of the following detailed description of a best mode embodiment thereof, as illustrated in the accompanying drawings.

BRIEF DESCRIPTION OF DRAWINGS

One skilled in the art can easily understand additional features and objects of this invention from the description of the preferred embodiments and by referring to the attached drawing, of which;

FIGS. 7A and 7B are schematic diagrams for explaining a multiplication process for filter coefficients with respect to a real component in accordance with the preferred embodiment;

FIGS. 8A and 8B are schematic diagrams for explaining a multiplication process for filter coefficients with respect to an imaginary component in accordance with the preferred embodiment;

FIGS. 9A, 9B and 9C are schematic diagrams for explaining a decimation filter portion of the preferred embodiment.

DESCRIPTION OF PREFERRED EMBODIMENTS

Figure 3:
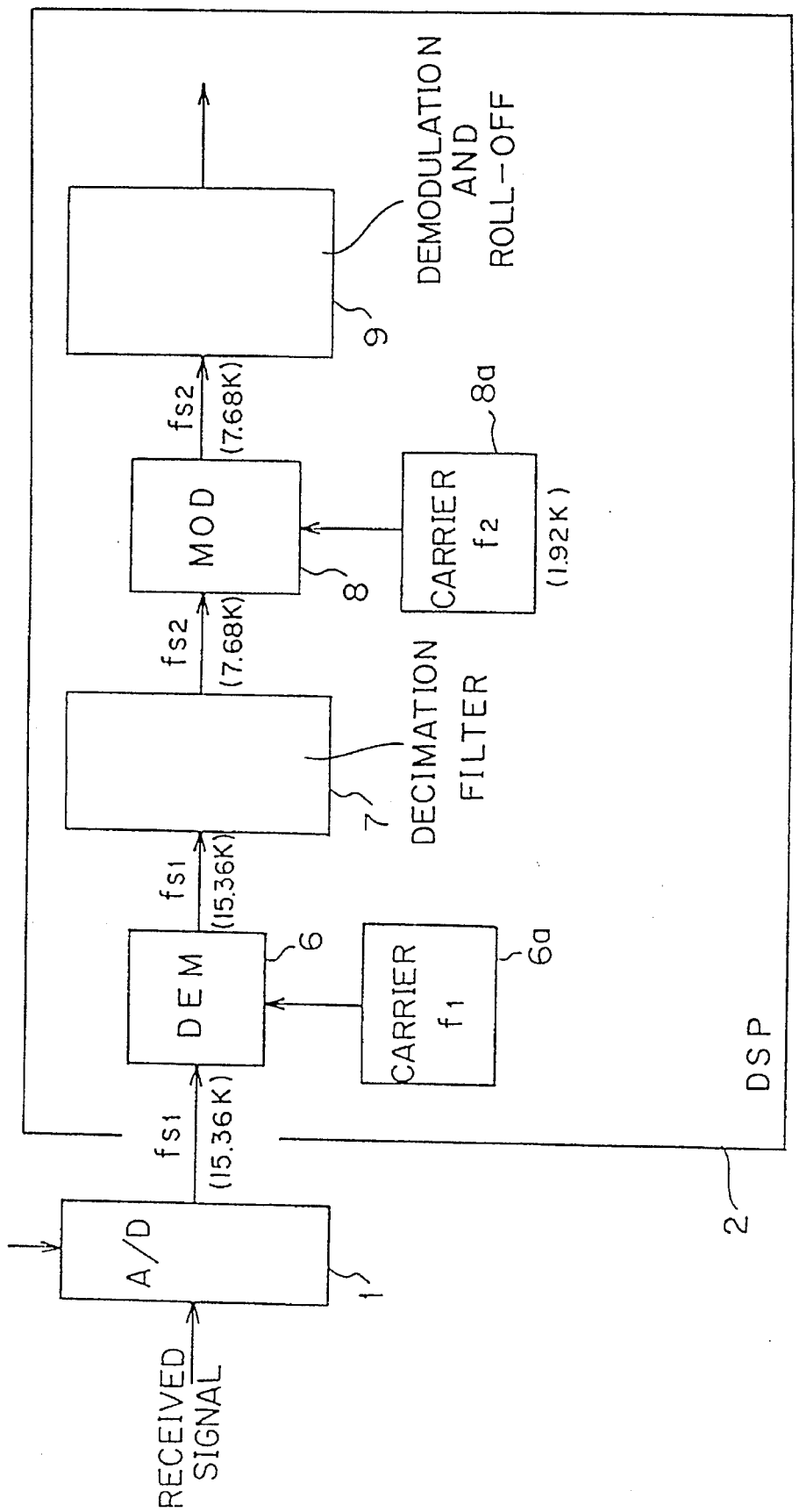
FIG. 3 is a schematic diagram showing the construction of a preferred embodiment.

FIG. 3 is a schematic diagram showing the construction of a preferred embodiment of the present invention.

Figure 1:
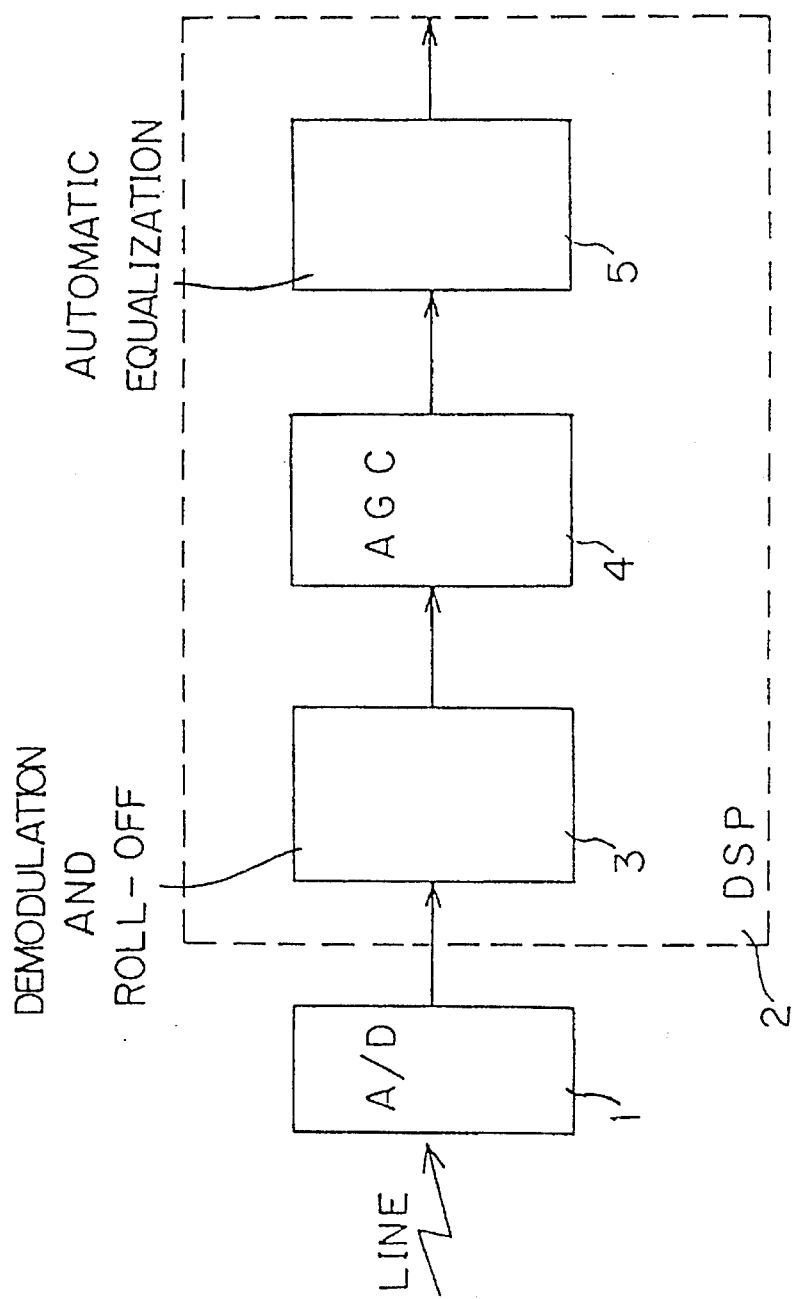
FIGS. 1 and 2 are schematic diagrams for explaining a related art reference.
Figure 2:
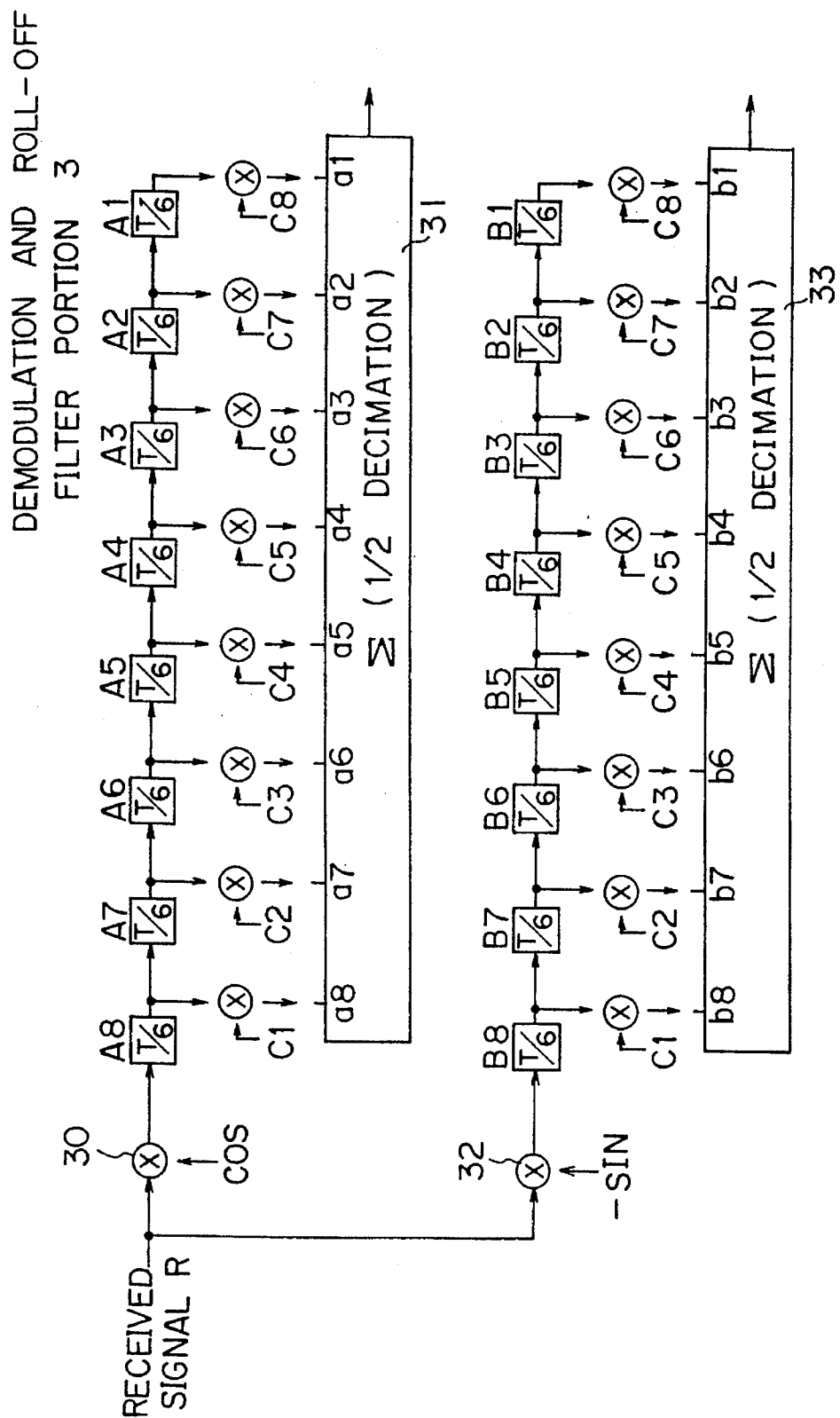

In FIG. 3, the portions which are the same as those in FIGS. 1 and 2 are denoted by the same reference numerals.

A demodulation portion 6 receives a pass-band signal from an A/D converter 1 and demodulates the signal with a demodulation carrier (whose frequency is $f_1$).

The demodulation carrier is generated by a demodulation carrier generation portion 6a. By using the demodulation carrier, the demodulation portion 6 extracts and outputs a base-band signal.

A decimation filter portion 7 lowers the sampling frequency of the base-band signal, which has been demodulated, from $f_{s1}$ to $f_{s2}$. The frequency $f_{s2}$ is four times higher than the demodulation carrier and is used by a demodulation and roll-off filter portion 9 (which will be described later with reference to FIGS. 9A and 9B). In addition, the decimation filter portion 7 removes unnecessary higher harmonic components from the signal.

A modulation portion 8 receives the base-band signal from the decimation filter portion 7 and modulates the signal with a modulation carrier (whose frequency is f2),. The modulation carrier is generated by a modulation carrier generation portion 8a. Thus, the modulation ]portion 8 generates a pass-band signal and outputs the signal.

The demodulation and roll-off filter portion 9 performs a demodulation process and a roll-off filter process on the pass-band signal received from the modulation portion 8. These processes will be described later (FIGS. 4 to 8A and 8B).

Thereafter, as in the construction shown in FIG. 1, an AGC portion (which is not shown in FIG. 3) automatically controls the gain of the digital signal which was shaped by the demodulation and roll-off filter portion 3 so as to keep the level thereof constant. The resultant signal is sent to an automatic equalizing portion (not shown in the figure). The automatic equalizing portion performs an equalization process on the received signal. Thus, communication data is reproduced.

Next, the construction and operation of the preferred embodiment will be described in detail.

Figure 4:
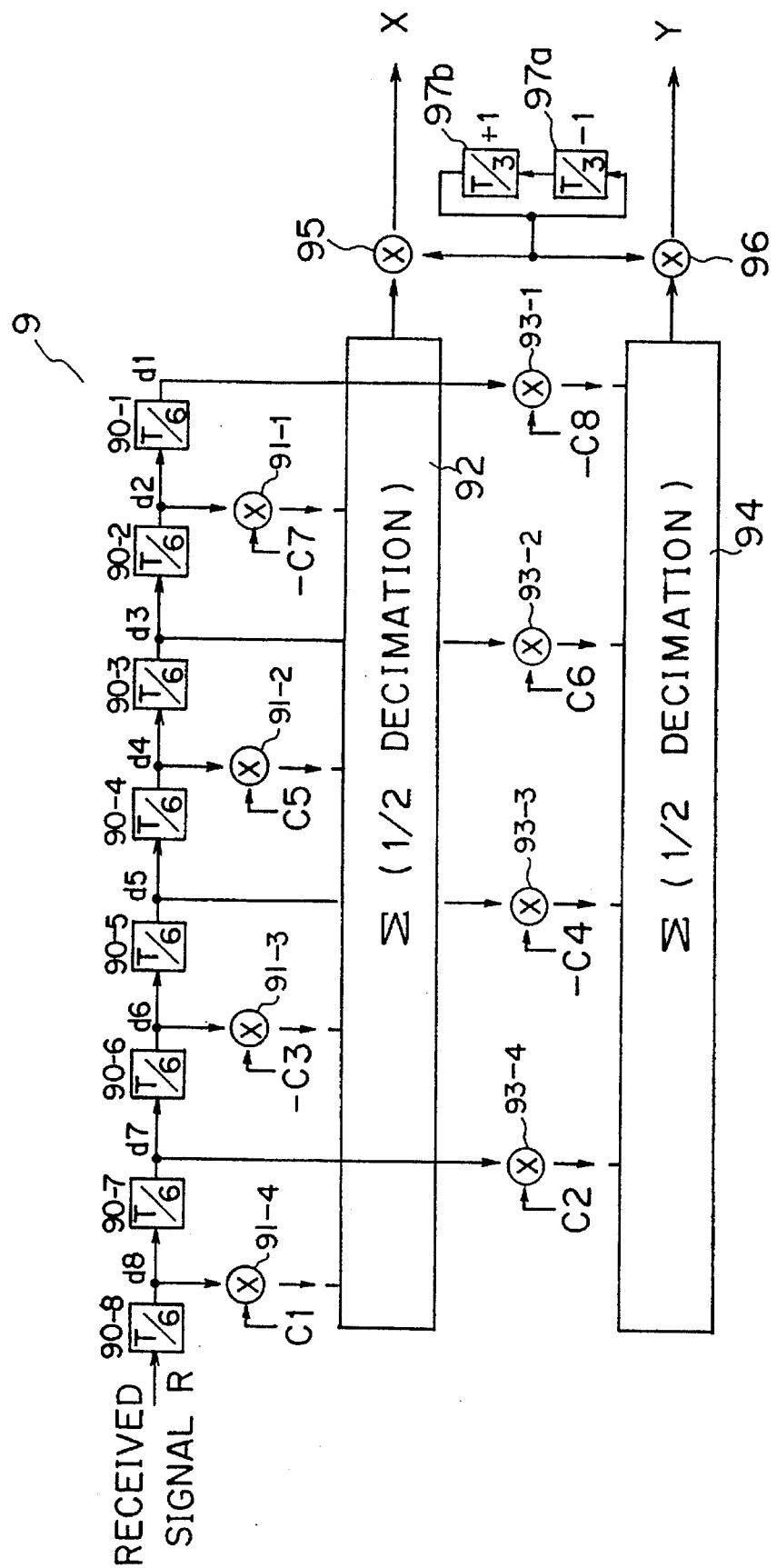
FIG. 4 is a schematic diagram for explaining a demodulation and roll-off filter portion of the preferred embodiment.

The demodulation and roll-off filter portion 9 has a function and construction accomplished by a simpler transversal filter, shown in FIG. 4, than that of the related art reference shown in FIG. 2.

In the construction shown in FIG. 4, although the number of stages of the transversal filter is eight, the present invention is not limited thereto.

In FIG. 4, the demodulation and roll-off filter portion 9 comprises eight taps 90-1 to 90-8, four multiplication portions 91-1 to 91-4, an addition portion 92, four multiplication portions 93-1 to 93-4, and an addition portion 94. The four multiplication portions 91-1 to 91-4 multiply even number tap outputs d2, d4, d6, and d8 by tap coefficients −C7, C5, −C3, and C1, respectively. The addition portion 92 adds the outputs of the multiplication portions 91-1 to 91-4 and outputs a real component X as the result of the additions. The four multiplication portions 93-1 to 93-4 multiply odd number tap outputs d1, d3, d5, and d7 by tap coefficients −C8, C6, −C4, and C2, respectively. The addition portion 94 adds the outputs of the multiplication portions 93-1 to 93-4 and outputs an imaginary component Y as the result of the additions.

In the multiplication process of the multiplication portions 91-1 to 91-4, the addition process of the addition portion 92, the multiplication process of the multiplication portions 93-1 to 93-4, and the addition process of the addition portion 94, for the tap outputs d2, d4, d6, and d8 and the tap outputs d1, d3, d5, and d7, a ½ decimation process for decimating samples at intervals of one discrete time apart is also executed.

In addition, the demodulation and roll-off filter portion 9 has multiplication portions 95 and 96 and polarity generation portions 97a and 97b. The multiplication portions 95 and 96 multiply the real component X and the imaginary component Y by +1 and −1, respectively. The polarity generation portions 97a and 97b generate polarity values +1 and −1 at intervals of T/3 time apart and output them to the multiplication portions 95 and 96, respectively.

The taps 90-1 to 90-8 are implemented in RAM devices in the DSP 2 (see FIG. 3). The polarity generation portions 97a and 97b are implemented in ROM devices in the DSP 2. The tap coefficients are stored in the ROM devices. The multiplications and additions are executed by the arithmetic and logic unit of the DSP 2. The demodulation and roll-off filter process is accomplished by the DSP 2 which executes predetermined microprograms.

Next, the theory of operation of the demodulation and roll-off filter portion 9 which has the abovementioned construction will be described.

The demodulation and roll-off filter portion 9 shown in FIG. 4 is derived from that shown in FIG. 2.

It is assumed that in the demodulation and roll-off filter portion 3 the sampling frequency of the received signal R is four times higher than the frequency of the cos carrier or −sin carrier which is a demodulation carrier.

In this case, each of the cos carrier and −sin carrier has four sample values in one period thereof. Thus, the following sampling timings of the cos carrier and the −sin carrier can be selected.

$$\begin{aligned} ts_n &= 2n\pi & [\text{rad}] \\ ts_{n+1} &= (2n + 1/2)\pi & [\text{rad}] \\ ts_{n+2} &= (2n + 1)\pi & [\text{rad}] \\ ts_{n+3} &= (2n + 3/2) & [\text{rad}] \end{aligned} \quad (1)$$

(where n is any integer)

Figure 5:
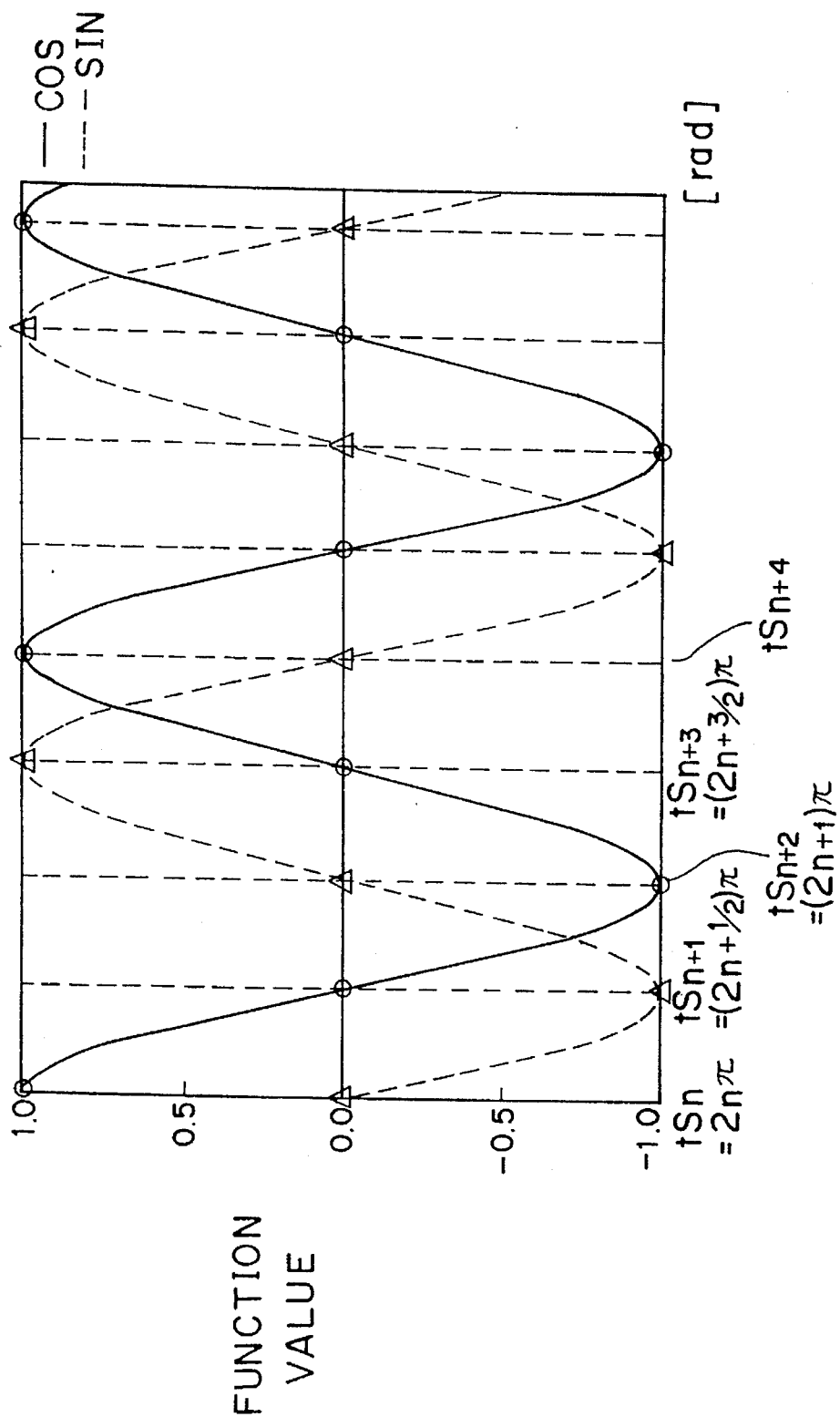
FIG. 5 is a graph for explaining a demodulation carrier in accordance with the preferred embodiment.

Thus, as a sample value sequence of the cos carrier multiplying a receive signal R in the multiplication portion 30, a sequence of values 1, 0, −1, 0, 1, 0, 3'1, 0, . . . and so forth which are indicated by 0 in FIG. 5 is obtained. On the other hand, as a sample value sequence of the −sin carrier multiplying a received signal R in the multiplication portion 32, a sequence of values 0, −1, 0, 1, 0, −1, 0, 1, . . . and so forth which are indicated by Δ in the figure is obtained.

Figure 6:
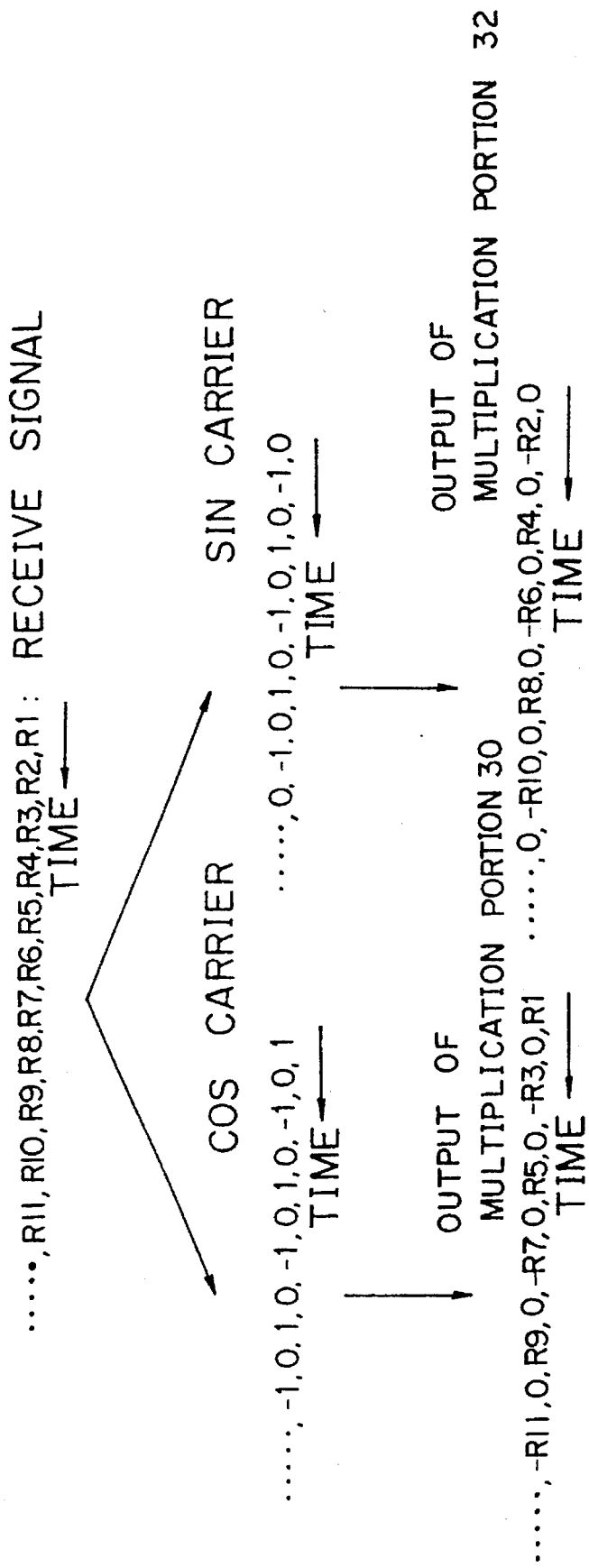
FIG. 6 is a schematic diagram showing a demodulated signal in accordance with the preferred embodiment.

Thus, when a received signal is a sequence of R1, R2, R3, R4, . . . and so forth, the multiplication portions 30 and 32 each output a sample sequence whose values are 0 at intervals of one sample apart as shown in FIG. 6.

When the two sample sequences are successively inputted to the tap sequence A8 to A1 and the tap sequence B8 to B1, respectively, the values of the inputs a8 to a1 of the addition portion 31 vary at successive discrete times $t_n$, $t_{n+1}$, $t_{n+2}$, . . . and so forth as shown in FIG. 7A. The values of the inputs b8 to b1 of the addition portion 33 vary as shown in FIG. 8A. Thus, at any discrete time, half the inputs a8 to a1 of the addition portion 31 are 0. Likewise, half the inputs b8 to b1 of the addition portion 33 are 0.

In addition, the multiplication results shown in FIGS. 7A and 8A can be modified into those shown in FIGS. 7B and 8B. In this case, the outputs of the tap sequence A8 to A1 and the tap sequence B8 to B1 are the received signal itself. Thus, the multiplication portions 30 and 32, the tap sequence A8 to A1, and the tap sequence B8 to B1 can be substituted with one tap sequence consisting of eight taps in which the received signal is directly input. When the tap outputs of the one tap sequence are denoted by d8, d7, . . . , d2, and d1, in the case where the decimation process is not performed, the real component X and imaginary component Y can be generally denoted by the following formulas.

$$
\begin{aligned}
t_{4k}: \quad X &= d7(-C2) + d5(+C4) + d3(-C6) + d1(+C8) \\
&= [d7(+C2) + d5(-C4) + d3(+C6) + d1(-C8)](-1) \\
Y &= d8(+C1) + d6(-C3) + d4(+C5) + d2(-C7) \\
&= [d8(+C1) + d6(-C3) + d4(+C5) + d2(-C7)](+1) \\
t_{4k+1}: \quad X &= d8(+C1) + d6(-C3) + d4(+C5) + d2(-C7) \\
&= [d8(+C1) + d6(-C3) + d4(+C5) + d2(-C7)](+1) \\
Y &= d7(+C2) + d5(-C4) + d3(+C6) + d1(-C8) \\
&= [d7(+C2) + d5(-C4) + d3(+C6) + d1(-C8)](+1) \\
t_{4k+2}: \quad X &= d7(+C2) + d5(-C4) + d3(+C6) + d1(-C8) \\
&= [d7(+C2) + d5(-C4) + d3(+C6) + d1(-C8)](+1) \\
Y &= d8(-C1) + d6(+C3) + d4(-C5) + d2(+C7) \\
&= [d8(+C1) + d6(-C3) + d4(+C5) + d2(-C7)](-1) \\
t_{4k+3}: \quad X &= d8(-C1) + d6(+C3) + d4(-C5) + d2(+C7) \\
&= [d8(+C1) + d6(-C3) + d4(+C5) + d2(-C7)](-1) \\
Y &= d7(-C2) + d5(+C4) + d3(-C6) + d1(+C8) \\
&= [d7(+C2) + d5(-C4) + d3(+C6) + d1(-C8)](-1)
\end{aligned} \quad (2)
$$

(where k=0, 1, 2, . . . etc.)

The formula (2) can be summarized as follows.

$$
\begin{aligned}
t_{4k}: \quad X &= \text{SIGMA2}*(-1) \\
Y &= \text{SIGMA1}*(+1) \\
t_{4k+1}: \quad X &= \text{SIGMA1}*(+1) \\
Y &= \text{SIGMA2}*(+1) \\
t_{4k+2}: \quad X &= \text{SIGMA2}*(+1) \\
Y &= \text{SIGMA1}*(-1) \\
t_{4k+3}: \quad X &= \text{SIGMA1}*(-1) \\
Y &= \text{SIGMA2}*(+1)
\end{aligned} \quad (3)
$$

(where k=0, 1, 2, . . . etc.)

SIGMA1 and SIGMA2 can be given by the following formulas.

$$
\begin{aligned}
\text{SIGMA1} &= d8(+C1) + d6(-C3) + d4(+C5) + d2(-C7) \\
\text{SIGMA2} &= d7(+C2) + d5(-C4) + d3(+C6) + d1(-C8)
\end{aligned} \quad (4)
$$

As in the formulas (3) and (4), when the sampling frequency of the received signal is four times as high as the frequency of the demodulation carrier, the number of arithmetic operations for multiplying each tap output by a relevant coefficient in the demodulation and roll-off filter process 3 and the number of arithmetic operations for adding the multiplications can be halved in comparison with the case where the above condition is not set. In addition, the multiplication portions 30 and 32 and the two tap sequences for the real and imaginary components which are required for the related art reference shown in FIG. 2 can be reduced to one tap sequence where the received signal is directly inputted. Thus, the number of arithmetic operations can be further decreased and the capacity of the RAM devices for the taps can be decreased. The process for separating SIGMA1 and SIGMA2 into the real component output and imaginary output component can be accomplished by a simple determination process. In addition, the process for multiplying each output by polarity value +1 or −1 can be accomplished by a process for selectively inverting the code of each output value.

In the above formulas (3) and (4), when the function of the ½ decimation process is executed, the arithmetic operations of the formulas (3) and (4) are executed at intervals of one discrete time apart (for example, $t_{4k+1}$, $t_{4k+3}$ (where k=0, 1, 2, . . . , etc.)) of intervals of T/6 discrete times apart $t_{4k}$, $t_{4k+1}$, $t_{4k+2}$, $t_{4k+3}$ (where k=0, 1, 2, . . . , etc). Thus, these arithmetic operations given by the following formulas are executed.

$$
\begin{aligned}
t_{4k+1}: \quad X &= \text{SIGMA1}*(+1) \\
Y &= \text{SIGMA2}*(+1) \\
t_{4k+3}: \quad X &= \text{SIGMA1}*(-1) \\
Y &= \text{SIGMA2}*(-1)
\end{aligned} \quad (5)
$$

(where k=0, 1, 2, . . . )

SIGMA1 and SIGMA2 are given by the formula (4). As in the formula (5), when the ½ decimation process is executed, SIGMA1 is dedicated to the calculation for the real component X. On the other hand, SIGMA2 is dedicated to the calculation for the imaginary component Y. Thereafter, SIGMA1 and SIGMA2 are multiplied by polarity values +1 and −1 which vary at intervals of T/3 apart, respectively. Thus, each multiplication result is output as the real component X and imaginary component Y.

According to the theory of the above-mentioned roll-off filter process, the function and construction of the demodulation and roll-off filter portion 9 shown in FIG. 4 is accomplished. In other words, one tap sequence 90-8 to 90-1 consisting of eight taps to which a received signal is directly input is provided. For even number tap outputs d8, d6, d4, and d2, a portion constructed of multiplication portions 91-4 to 91-1 and an addition portion 92 calculate the SIGMA1 of the formula (1). For odd number tap outputs d7, d5, d3, and d1, a portion constructed of multiplication portions 93-4 to 93-1 and an addition portion 94 calculate the SIGMA2 of the formula (4).

A portion constructed of multiplication portions 95 and 96 and polarity generation portions 97a and 97b execute the arithmetic operations given by the formula (5) where the real component X and imaginary component Y are multiplied by a polarity value +1 or −1 at intervals of T/3 apart.

Thus, when the sampling frequency of the received signal R is four times higher than the frequency of the demodulation carrier, the demodulation and roll-off filter portion 9 shown in FIG. 4 whose construction is simpler than that of the related art reference shown in FIG. 2 can be accomplished.

When the demodulation and roll-off filter portion shown in FIG. 4 is used in the system of the related art reference shown in FIG. 1, the sampling frequency of the A/D converter 1 shown in FIG. 1 should be four times as high as the frequency of the demodulation carrier so that the sampling frequency of the received signal R becomes four times higher than the frequency of the demodulation frequency. However, the sampling frequency of the A/D converter 1 should be so high as to suppress loop-back noise which will be entered from other than the frequency band of the transmission line. When the received signal is modulated according to the FDM (Frequency Division Modulation), since a plurality of carrier frequencies are required, the A/D converter 1 should have a plurality of sampling frequencies.

A feature of the preferred embodiment of the present invention is in that as shown in FIG. 3 a portion constructed of the demodulation portion 6, the decimation filter portion 7, and the modulation portion 8 converts for the sampling frequency of the received signal any sampling frequency of the A/D converter 1 into a frequency four times higher than the frequency of the demodulation carrier used for the demodulation and roll-off filter portion 9.

Next, with reference to FIGS. 9A, 9B, 9C and 10A to 10E, the construction and operation of the feature portion of the preferred embodiment will be described.

Now, assume that the carrier frequency of the received signal is 1.92 kHz and the sampling frequency $f_{s1}$ of the A/D converter 1 is 15.36 kHz which is eight times higher than that of the carrier frequency. In addition, assume that the transmission line for use is a telephone line. The signal received from this line has a frequency band ranging from 0.3 kHz to 3.4 kHz.

Figure 10A:
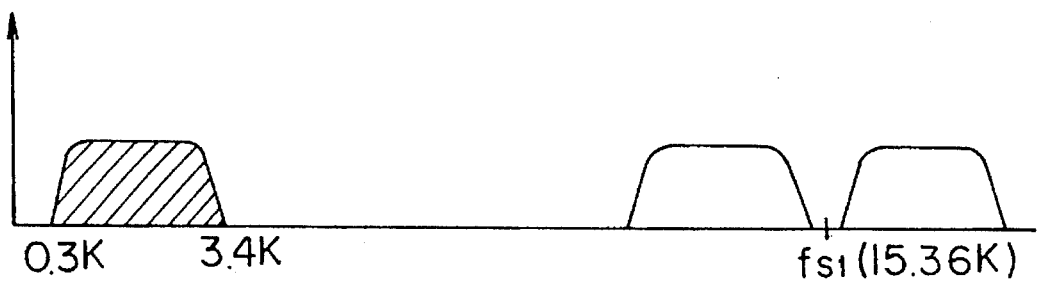
FIGS. 10A to 10E are schematic diagrams for explaining the operation of the preferred embodiment.

When the A/D converter 1 converts the received signal into a digital value at the sampling frequency of $f_{s1}$=15.36 kHz, a frequency spectrum shown in FIG. 10A is obtained. In other words, a frequency component of the received signal is present in a frequency band ranging from 0.3 kHz to 3.4 kHz. Two echo components of the frequency component are present on both sides of the sampling frequency $f_{s1}$ of 15.36 kHz.

Figure 10B:
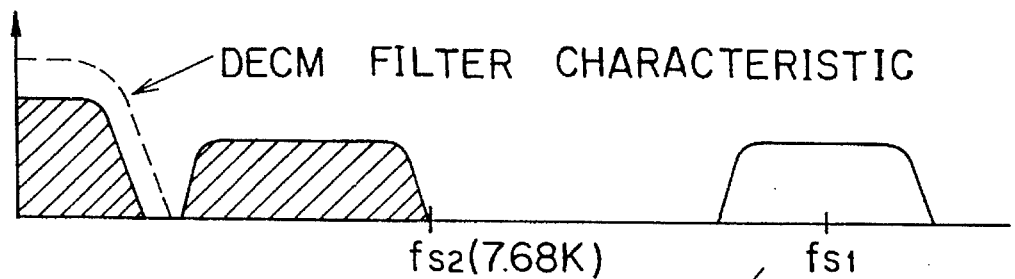
Figure 10C:
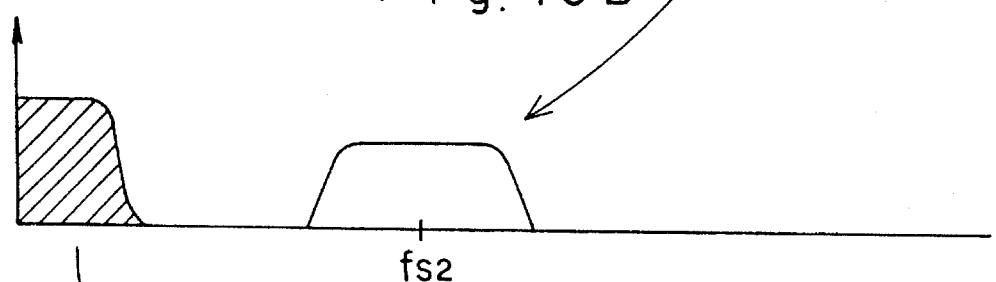

When the digital signal is demodulated with the demodulation carrier (whose frequency $f_1$ is for example 1.92 kHz), a pass-band signal is converted into a base-band signal. Thus, a frequency spectrum shown in FIG. 10B is obtained. To put it differently, in this frequency spectrum, a base-band signal component, which is the received signal component, and a higher harmonic component are present. An echo component of the base-band signal component is present with a center frequency of 15.36 kHz which is equal to the sampling frequency $f_{s1}$.

The decimation filter portion 7 converts for the demodulated signal having the frequency spectrum shown in FIG. 10B the sampling frequency of the A/D converter 1 ($f_{s1}$= 15.36 kHz) into the frequency $f_{s2}$ which is four times higher than the frequency of the demodulation carrier used for the demodulation and roll-off filter portion 9.

Figure 9A:
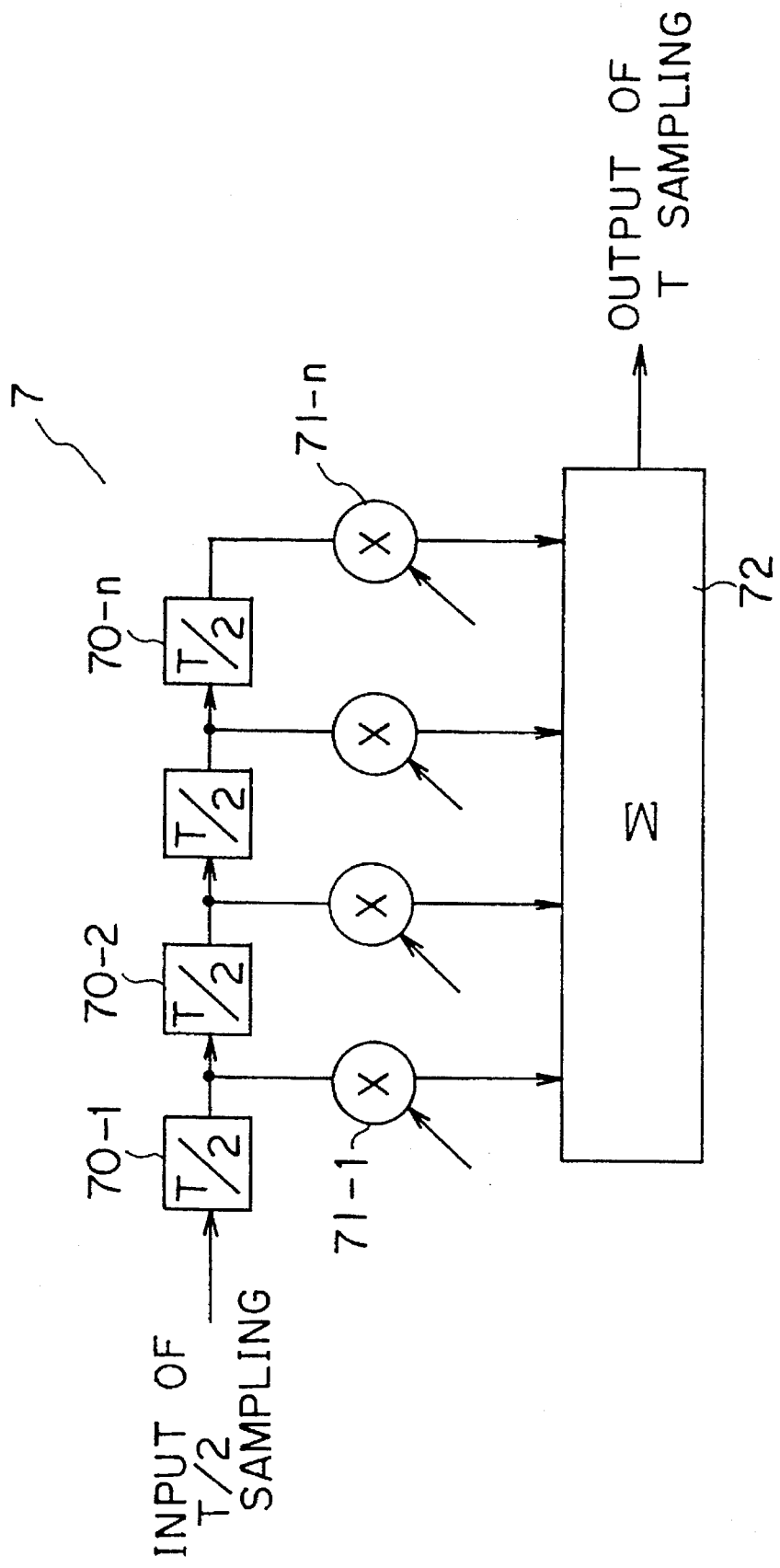

The decimation filter portion 7 has the construction of a transversal filter as shown in FIG. 9A. In other words the decimation filter portion 7 comprises n taps 70-1 to 70-n, multiplication portions 71-1 to 71-n, and an addition portion 72. The multiplication portions 71-1 to 71-n multiply the outputs of the taps 70-1 to 70-n by tap coefficients, respectively. The addition portion 72 adds the outputs of the multiplication portions 71-1 to 71-n.

The filter portion 7 has a frequency transmission characteristic shown by a broken line of FIG. 10B. Thus, the higher harmonic component of the base-band signal component shown in FIG. 10B can be removed. In the multiplication process of the multiplication portions 71-1 to 71-n and the addition process of the addition portion 72, a ½ decimation process for decimating samples from the sample sequence of the outputs of the taps 70-1 to 70-n at intervals of one discrete time apart can be also executed as shown in FIG. 10B.

Thus, the frequency spectrum of the output of the decimation filter portion 7 has an echo component with a center frequency of 7.68 kHz converter from 15.36 kHz shown in FIG. 10B.

Figure 10D:
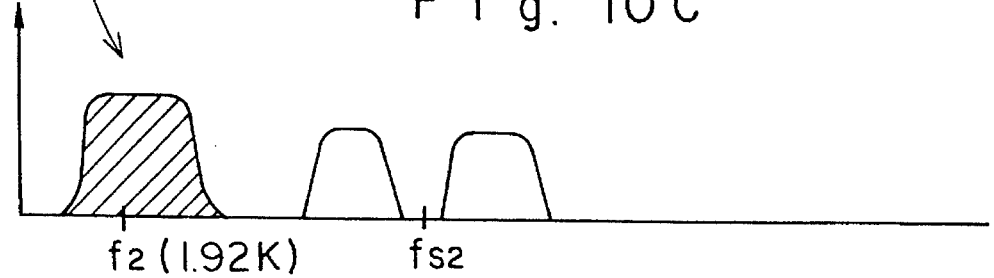

The modulation portion 8 shown in FIG. 3 modulates the output signal of the decimation filter portion 7 with the modulation carrier (whose frequency f2 is for example 1.92 kHz) generated by the modulation carrier generation portion 8a. Thus, a pass-band signal is obtained. As a result, a frequency spectrum shown in FIG. 10D is obtained as the output of the modulation portion 8. To put differently, in the frequency spectrum, a frequency component of the pass-band signal is present. Two echo components of the frequency component are present on both sides of a frequency $f_{s2}$=7.68 kHz which is four times higher than the frequency of the demodulation carrier.

Figure 10E:
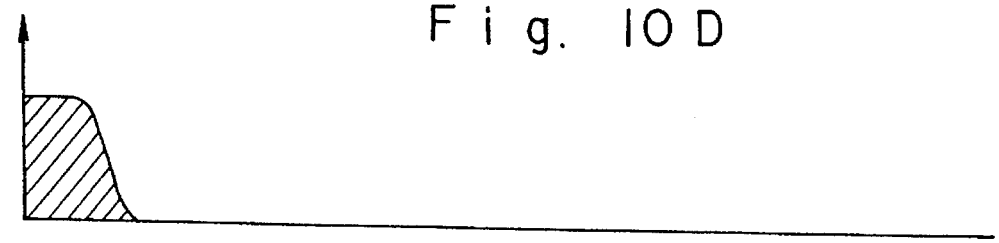

Thus, the sampling frequency of the received signal can be raised from any sampling frequency of the A/D converter 1 to the frequency four times higher than the frequency of the demodulation carrier used for the demodulation and roll-off filter portion 9. In the condition where the sampling frequency of the received signal is four times higher than the frequency of the demodulation carrier, the demodulation and roll-off filter portion 9 executes the above-mentioned simplified demodulation and roll-off filter process. Thus, a demodulated base-band signal with a frequency spectrum shown in FIG. 10E is obtained.

Thus, in the condition where the roll-off ratio is lowered and the amount of attenuation of unnecessary band components is increased, the demodulation and roll-off filter portion 9 can roughly halve the number of arithmetic operations and the RAM capacity in comparison with the related art reference. In addition, as shown in FIG. 10B, the decimation filter portion 7 has a function for attenuating unnecessary band components. Thus, in the demodulation and roll-off filter portion 9, the condition of the attenuation function for the unnecessary band components can be alleviated. As a result, the number of arithmetic operations and the RAM capacity for the taps of the demodulation and roll-off filter portion 9 can be further reduced.

For example, for a high speed data transmission with a baud rate of 1.92 kHz, the apparatus according to the related art reference requires 492 taps (words as RAM capacity), 492 tap coefficients (words), 492 arithmetic operations. However, the apparatus according to the preferred embodiment only requires 246 taps (words), 246 tap coefficients (words), and 24 arithmetic operations. Even if 17 taps and 17 arithmetic operations for the decimation filter portion 7 are added, the RAM capacity and the number of arithmetic operations can be remarkably reduced. Thus, the size and cost of the apparatus (modem) can be reduced.

Since the frequency $f_2$ for the modulation carrier used for the modulation portion shown in FIG. 3 and generated by the modulation carrier generation portion 8a is set to the same frequency as the frequency (1.92 kHz) for the demodulation carrier used for the demodulation and roll-off filter portion 9, a simple sample sequence of cos carrier and −sin carrier which is similar to that shown in FIG. 5 can be selected. Thus, the modulation process can be further simplified.

In the above-mentioned preferred embodiment, the frequency of the demodulation carrier used for the demodulation portion 6 is equal to the baud rate, which is 1.92 kHz. However, when the frequency of the demodulation carrier is a frequency at which a pass-band signal can be converted into the base-band signal, the value of the frequency can be freely set.

Moreover, in the above-mentioned preferred embodiment, the DSP 2 shown in FIG. 3 has one system of the portion constructed of the demodulation portion 6, the decimation and filter portion 7, the modulation portion 8, and the demodulation and roll-off filter portion 9. However, when the received signal is modulated according to the FDM (Frequency Division Modulation), a plurality of the systems can be disposed according to a plurality of carriers.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A demodulation and roll-off filter apparatus for performing a demodulation and roll-off filter process for a received digital signal sampled by an analog/digital converter, comprising:

sampling frequency set means for setting a sampling frequency of said received digital signal to a frequency four times higher than the frequency of a demodulation carrier therefor;

tap means, connected in a cascade shape one after the other, for delaying samples of said received digital signal by a predetermined time, the first tap of said tap means being connected to said sampling frequency means;

first multiplication means for multiplying outputs of a first group of said tap means disposed at intervals of one discrete time apart by first tap coefficients, said first group comprising taps disposed at intervals of one tap apart;

first addition means for adding outputs of said first multiplication means;

first polarity setting means for multiplying one of a first polarity and a second polarity to the result of the addition by said first addition means during cyclically generated timing intervals, and for outputting the result as a real component;

second multiplication means for multiplying outputs of a second group other than said first group of said tap means disposed at intervals of one discrete time apart by second tap coefficients, said second group comprising taps disposed at intervals of one tap apart;

second addition means for adding outputs of said second multiplication means; and second polarity addition means for multiplying one of the first polarity and the second polarity to the result of the addition by said second addition means, during cyclically generated timing intervals and for outputting the result as an imaginary component.

2. The apparatus as set forth in claim 1, wherein said sampling frequency set means comprises:

pass-band/base-band conversion means for converting said received digital signal which is a pass-band signal received from said analog/digital converter into a base-band signal, said pass-band signal having any sampling frequency, said base-band signal having a first frequency;

decimation process means for performing a filter process and a decimation process for said base-band signal received from said pass-band/base-band conversion means, so as to convert any sampling frequency of said base-band signal into a frequency four times higher than the frequency of a demodulation carrier for said received digital signal, said filter means being adapted to attenuate a component with a frequency exceeding a predetermined frequency contained in said base-band signal, said decimation process being adapted to decimate samples of said base-band signal at intervals of a predetermined discrete time apart; and base-band/pass-band conversion means for converting said base-band signal received from said decimation process means into said pass-band signal with a second frequency and for inputting said pass-band signal to said first tap of said tap means.

3. The apparatus as set forth in claim 2, wherein said second frequency is the frequency of the demodulation carrier for said received digital signal.

4. A demodulation and roll-off filter apparatus for performing a demodulation and roll-off filter process for a received digital signal sampled by an analog/digital converter, comprising:

sampling frequency set means for setting a sampling frequency of said received digital signal to a frequency four times higher than the frequency of a demodulation carrier therefor;

tap means, connected in a cascade shape one after the other, for delaying samples of said received digital signal by a predetermined time, the first tap of said tap means being connected to said sampling frequency set means;

first multiplication means for multiplying outputs of a first group of said tap means disposed at intervals of one discrete time interval apart by first tap coefficients during a first and a third time interval and by second tap coefficients during a second and a fourth time interval, said first group comprising taps disposed at intervals of one tap apart, said first, second, third and fourth time intervals being cyclically generated;

first polarity setting means for multiplying one of a first and second polarity by the result of the additions of said first addition means during said first through fourth time intervals, respectively, and for outputting the result as a real component;

second multiplication means for multiplying outputs of a second group other than said first group of said tap means disposed at intervals of one discrete time interval part by said second tap coefficients during said first and third time intervals and by said first tap coefficients during said second and fourth time intervals, said second group comprising taps disposed at intervals of one tap apart;

second addition means for adding outputs of said second multiplication means; and second polarity setting means for multiplying one of a first and second polarity by the result of the addition of said second addition means during said first through fourth time intervals, respectively, and for outputting the result as an imaginary component.

5. The apparatus as set forth in claim 4, wherein said sampling frequency set means comprises:

pass-band/base-band conversion means for converting said received digital signal which is a pass-band signal received from said analog/digital converter into a base-band signal, said pass-band signal having any sampling frequency, said base-band signal having a first frequency;

decimation process means for performing a filter process and a decimation process for said base-band signal received from said pass-band/base-band conversion means, so as to convert any sampling frequency of said base-band signal into a frequency four times higher than the frequency of a demodulation carrier for said received digital signal, said filter means being adapted to attenuate a component with a frequency exceeding a predetermined frequency contained in said base-band signal, said decimation process being adapted to decimate samples of said base-band signal at intervals of a predetermined discrete time apart; and base-band/pass-band conversion means for converting said base-band signal received from said decimation process means into said pass-band signal with a second frequency and for inputting said pass-band signal to said first tap of said tap means.

6. The apparatus as set forth in claim 5, wherein said second frequency is the frequency of the demodulation carrier for said received digital signal.

7. A demodulation and roll-off filter apparatus for performing a demodulation and roll-off filter process for a received digital signal sampled by an analog/digital converter, comprising:

sampling frequency set means for setting a sampling frequency of said received digital signal to a frequency four times higher than the frequency of a demodulation carrier therefor;

tap means, connected in a cascade shape one after the other, for delaying samples of said received digital signal by a predetermined time, the first tap of said tap means being connected to said sampling frequency set means;

first multiplication means for multiplying outputs of a first group of said tap means disposed at intervals of one discrete time apart by first tap coefficients during a first time interval, by second tap coefficients during a second time interval, by third tap coefficients during a third time interval, and by fourth tap coefficients during a fourth time interval, said first group comprising taps disposed at intervals of one tap apart, said first to fourth time intervals be cyclically generated;

first addition means for adding outputs of said first multiplication means as a real component;

second multiplication means for multiplying outputs of a second group of said tap means other than said first group of said tap means disposed at intervals of one discrete time interval apart by fifth sixth, seventh and eighth tap coefficients during said first, second, third and fourth time intervals, respectively, said second group comprising taps disposed at intervals of one tap apart; and second addition means for adding outputs of said second multiplication means as an imaginary component.

8. The apparatus as set forth in claim 7, wherein said sampling frequency set means comprises:
pass-band/base-band conversion means for converting said received digital signal which is a pass-band signal received from said analog/digital converter into a base-band signal, said pass-band signal having any sampling frequency, said base-band signal having a first frequency;

decimation process means for performing a filter process and a decimation process for said base-band signal received from said pass-band/base-band conversion means, so as to convert any sampling frequency of said base-band signal into a frequency four times higher than the frequency of a demodulation carrier for said received digital signal, said filter means being adapted to attenuate a component with a frequency exceeding a predetermined frequency contained in said base-band signal, said decimation process being adapted to decimate samples of said base-band signal at intervals of a predetermined discrete time apart; and base-band/pass-band conversion means for converting said base-band signal received from said decimation process means into said pass-band signal with a second frequency and for inputting said pass-band signal to said first tap of said tap means.

9. The apparatus as set forth in claim 8, wherein said second frequency is the frequency of the demodulation carrier for said received digital signal.

10. A demodulation and roll-off filter for performing a demodulation and roll-off filter process on samples of a received digital signal, comprising:

a single delay line receiving the samples of the received digital signals and outputting a first and a second grouping of the samples of the received digital signals;

a first multiplication unit receiving the first grouping of signals and outputting respective signals of the first grouping multiplied by respective first coefficients;

a second multiplication unit receiving the second grouping of signals and outputting respective signals of the second grouping multiplied by respective second coefficients;

a first addition unit to add the outputs of the first multiplication units;

a second addition unit to add the outputs of the second multiplication unit;

a first polarity setting unit setting a polarity of an output of the first addition unit and outputting a result as a real component; and a second polarity setting unit setting a polarity of an output of the second addition unit and outputting a result as an imaginary component.

* * * * *

UNITED STATES PATENT AND TRADEMARK OFFICE
CERTIFICATE OF CORRECTION

PATENT NO. : 5,557,632
DATED : September 17, 1996
INVENTOR(S) : Takashi KAKU, et al.

It is certified that error appears in the above-indentified patent and that said Letters Patent is hereby corrected as shown below:

Col. 6, line 43, change "3'1" to --⁻1--

Signed and Sealed this

Seventeenth Day of December, 1996

Attest:

BRUCE LEHMAN

Attesting Officer        Commissioner of Patents and Trademarks